US010998863B2

(12) United States Patent
Day (10) Patent No.: US 10,998,863 B2
(45) Date of Patent: May 4, 2021

(54) POWER AMPLIFIER WITH NULLING MONITOR CIRCUIT (71) Applicant: Analog Devices, Inc., Norwood, MA (US)

(72) Inventor: Christopher John Day, Santa Rosa, CA (US)

(73) Assignee: Analog Devices, Inc., Norwood, MA (US)

(*) Notice: Subject to any disclaimer, the term of this patent is extended or adjusted under 35 U.S.C. 154(b) by 54 days.

(21) Appl. No.: 16/133,282

(22) Filed: Sep. 17, 2018

(65) Prior Publication Data
US 2019/0115876 A1    Apr. 18, 2019

Related U.S. Application Data (60) Provisional application No. 62/572,682, filed on Oct. 16, 2017, provisional application No. 62/678,412, filed on May 31, 2018.

(51) Int. Cl.
*H03F 3/45* (2006.01)
*H03F 1/32* (2006.01)
(Continued)

(52) U.S. Cl.
CPC .............. *H03F 1/32* (2013.01); *H03F 1/223* (2013.01); *H03F 3/195* (2013.01); *H03F 3/213* (2013.01);
(Continued)

(58) Field of Classification Search
CPC ........ H03F 1/32; H03F 3/195; H03F 3/45475; H03F 1/223; H03F 3/45179; H03F 3/213; H03F 3/245
(Continued)

(56) References Cited

U.S. PATENT DOCUMENTS 4,146,844 A    3/1979   Quinn
6,118,339 A *  9/2000   Gentzler ............... H03F 1/3241
                                                        327/359
(Continued)

FOREIGN PATENT DOCUMENTS

CN    1129266 C     11/2003
EP    3471268       4/2019
JP    2011009855 A  1/2011

OTHER PUBLICATIONS

Zanchi, Marta Gaia, et al., "Frequency-Offset Cartesian Feedback for MRI Power Amplifier Linearization", IEEE Trans Med Imaging. Author manuscript; available in PMC Feb. 1, 2012 (Feb. 2011), 34 pages.
(Continued)

*Primary Examiner* — Khanh V Nguyen
*Assistant Examiner* — Khiem D Nguyen
(74) *Attorney, Agent, or Firm* — Schwegman Lundberg & Woessner, P.A.

(57) ABSTRACT

Techniques for monitoring a distortion signal of a power amplifier circuit, where the output of a distortion monitoring circuit includes little or no fundamental signal and closely represents the actual distortion of the amplifier circuit of a wired communications system. The power amplifier circuit can generate a distortion feedback signal that does not affect the power amplifier's output power capability, e.g., no inherent loss in the fundamental output of the amplifier. That is, using a distortion monitor circuit, the power amplifier circuit can resolve a distortion feedback signal from the intended output signal of the output power amplifier circuit.

20 Claims, 8 Drawing Sheets

(51) Int. Cl.
*H03F 3/213* (2006.01)
*H03F 3/24* (2006.01)
*H03F 3/195* (2006.01)
*H03F 1/22* (2006.01)
*H03M 1/00* (2006.01)
*H03M 1/06* (2006.01)
*H03M 1/18* (2006.01)
*H04B 1/04* (2006.01)

(52) U.S. Cl.
CPC ......... *H03F 3/245* (2013.01); *H03F 3/45179* (2013.01); *H03F 3/45475* (2013.01); *H03M 1/002* (2013.01); *H03M 1/0614* (2013.01); *H03M 1/183* (2013.01); *H04B 1/0475* (2013.01); *H03F 2200/06* (2013.01); *H03F 2200/09* (2013.01); *H03F 2200/144* (2013.01); *H03F 2200/181* (2013.01); *H03F 2200/216* (2013.01); *H03F 2200/297* (2013.01); *H03F 2200/301* (2013.01); *H03F 2200/306* (2013.01); *H03F 2200/42* (2013.01); *H03F 2200/451* (2013.01); *H03F 2200/453* (2013.01); *H03F 2200/456* (2013.01); *H03F 2200/495* (2013.01); *H03F 2200/498* (2013.01); *H03F 2200/541* (2013.01); *H03F 2203/45008* (2013.01); *H03F 2203/45018* (2013.01); *H03F 2203/45036* (2013.01); *H03F 2203/45114* (2013.01); *H03F 2203/45116* (2013.01); *H03F 2203/45134* (2013.01); *H03F 2203/45156* (2013.01); *H03F 2203/45201* (2013.01); *H03F 2203/45251* (2013.01); *H03F 2203/45258* (2013.01); *H03F 2203/45296* (2013.01); *H03F 2203/45312* (2013.01); *H03F 2203/45316* (2013.01); *H03F 2203/45336* (2013.01); *H03F 2203/45338* (2013.01); *H03F 2203/45392* (2013.01); *H03F 2203/45458* (2013.01); *H03F 2203/45468* (2013.01); *H03F 2203/45496* (2013.01); *H03F 2203/45512* (2013.01); *H03F 2203/45526* (2013.01); *H03F 2203/45528* (2013.01); *H03F 2203/45544* (2013.01); *H03F 2203/45554* (2013.01); *H03F 2203/45601* (2013.01); *H03F 2203/45632* (2013.01); *H03F 2203/45638* (2013.01); *H03F 2203/45692* (2013.01); *H03F 2203/45698* (2013.01)

(58) Field of Classification Search
USPC .................................. 330/260, 149, 96, 285
See application file for complete search history.

(56) References Cited

U.S. PATENT DOCUMENTS

| | | | |
|---|---|---|---|
| 6,269,165 B1 | 7/2001 | Stott et al. | |
| 7,200,223 B2 | 4/2007 | Fortier | |
| 7,598,714 B2 | 10/2009 | Stanley | |
| 7,928,867 B2 | 4/2011 | Straeussnigg et al. | |
| 8,750,493 B2 | 6/2014 | Thi et al. | |
| 9,054,940 B2 | 6/2015 | Ma et al. | |
| 9,344,046 B2 | 5/2016 | Wang et al. | |
| 2002/0171485 A1* | 11/2002 | Cova | H03F 1/3258 330/149 |
| 2005/0226439 A1 | 10/2005 | Ludeman | |
| 2010/0285738 A1 | 11/2010 | Howard et al. | |
| 2011/0075745 A1 | 3/2011 | Kleider et al. | |
| 2011/0291764 A1 | 12/2011 | Kobayashi | |
| 2014/0308908 A1 | 10/2014 | Aalto et al. | |

OTHER PUBLICATIONS

"European Application Serial No. 18200452.3, Extended European Search Report dated Mar. 18, 2019", 13 pgs.

* cited by examiner

POWER AMPLIFIER WITH NULLING MONITOR CIRCUIT

CLAIM OF PRIORITY

This application claims the benefit of priority of U.S. Provisional Patent Application Ser. No. 62/572,682, titled "FULL DUPLEX NULLING MONITOR" to Chris J. Day, filed on Oct. 30, 2017, and U.S. Provisional Patent Application Ser. No. 62/678,412, titled "FULL DUPLEX NULLING MONITOR" to Christopher John Day, filed on May 31, 2018, the entire contents of each being incorporated herein by reference.

FIELD OF THE DISCLOSURE

This document pertains generally, but not by way of limitation, to integrated circuits, and more particularly, to amplifiers such as for cable television or other wired communications.

BACKGROUND

Certain communication devices transmit and receive signals over a wired communication medium, such as a telephone or cable line. These communication devices can include a transmitter and a receiver (sometimes referred to collectively as a transceiver) coupled to the communication medium through a line interface. Among other things, the line interface generally acts as the electrical interface between the transceiver and the line.

Transmitted signals can be reflected back to the receiver so as to constitute part of the received signals. These reflected signals are often referred to as "echoes." To improve the dynamic range of the receiver, it can be desirable to monitor and cancel these echoes at the transmitter.

SUMMARY

The present inventor has recognized a need to improve the headroom and power consumption of an analog-to-digital converter (ADC) in a wired communication network. The present inventor has recognized that the distortion signal of the output power amplifier circuit (also referred to as a "doubler") can be resolved from the intended output signal of the output power amplifier circuit and can be fed back to a lower power and lower cost ADC for signal processing in an echo cancellation scheme.

In some aspects, this disclosure is directed to a method of reducing an amount of distortion in an output signal of a power amplifier circuit in a wired communication network, the method comprising: receiving an input signal at a first input of the power amplifier circuit; using a distortion monitoring circuit in the power amplifier circuit, generating a distortion feedback signal resolved from an intended output signal at a first output of the power amplifier circuit; and generating the output signal from the intended output signal at a second output of the power amplifier circuit.

In some aspects, this disclosure is directed to a power amplifier circuit configured to reduce an amount of distortion in an output signal in a wired communication network, the circuit comprising: an input to receive an input signal; a distortion monitoring circuit configured to generate and output a distortion feedback signal resolved from an intended output signal at a first output; and a second output to provide the output signal.

In some aspects, this disclosure is directed to a power amplifier circuit configured to reduce an amount of distortion in an output signal in a wired communication network, the circuit comprising: means for receiving an input signal at a first input of the power amplifier circuit; means for generating a distortion feedback signal resolved from an intended output signal at a first output of the power amplifier circuit; and means for generating the output signal from the intended output signal at a second output of the power amplifier circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Power amplifier circuits can generate distortion signals as a result of non-linearities in the components of the power amplifier. One issue with monitoring a reflected signal of a full duplex system for echo cancellation is that the reflected signal often includes both the desired fundamental signal and the distortion signal of the power amplifier. A result can be a need for a very high-performance analog-to-digital converter (ADC) to capture both the desired fundamental signal and the distortion signal of the reflected signal. The output of the ADC can be used by a digital signal processor to correct for any echo in the communications system, e.g., broadband communications systems such as cable television.

The present inventor has recognized a need to improve the headroom and the power consumption of the ADC in the system. The present inventor has recognized that the intermodulation distortion terms of the output power amplifier circuit (also referred to as a "doubler") can be resolved from the intended output signal of the output power amplifier circuit and can be fed back to a combiner circuit and combined with the input signal to reduce or null the amount of distortion in the transmit signal.

This disclosure describes techniques for monitoring a distortion signal of a power amplifier circuit of a broadband communications system, where the output of a distortion monitoring circuit includes little or no fundamental signal and closely represents the actual distortion of the amplifier circuit of a wired communications system. Using various techniques of this disclosure, the power amplifier circuit can generate a distortion feedback signal that does not affect the power amplifier's output power capability, e.g., no inherent loss in the fundamental output of the amplifier. That is, using a distortion monitor circuit, the power amplifier circuit can resolve a distortion feedback signal from the intended output signal of the output power amplifier circuit. These techniques contrast with other approaches in which a power amplifier's RF output is sampled, which will reduce the strength of the amplifier output and result in power loss.

This disclosure describes, among other things, two monitoring approaches that can be used either separately or together to monitor the distortion of the power amplifier circuit in the system: a partial (e.g., bottom stage transconductance) monitoring approach and a full output monitoring approach. The partial monitoring approach and the full output monitoring approach both can utilize "virtual ground" potential (also referred to as simply "virtual ground" in this disclosure) techniques. These approaches can provide adequate cancellation of the fundamental signal, resulting in a distortion monitoring output signal that predominantly includes the intermodulation distortion signal terms, e.g., the third order intermodulation distortion terms.

Figure 1:
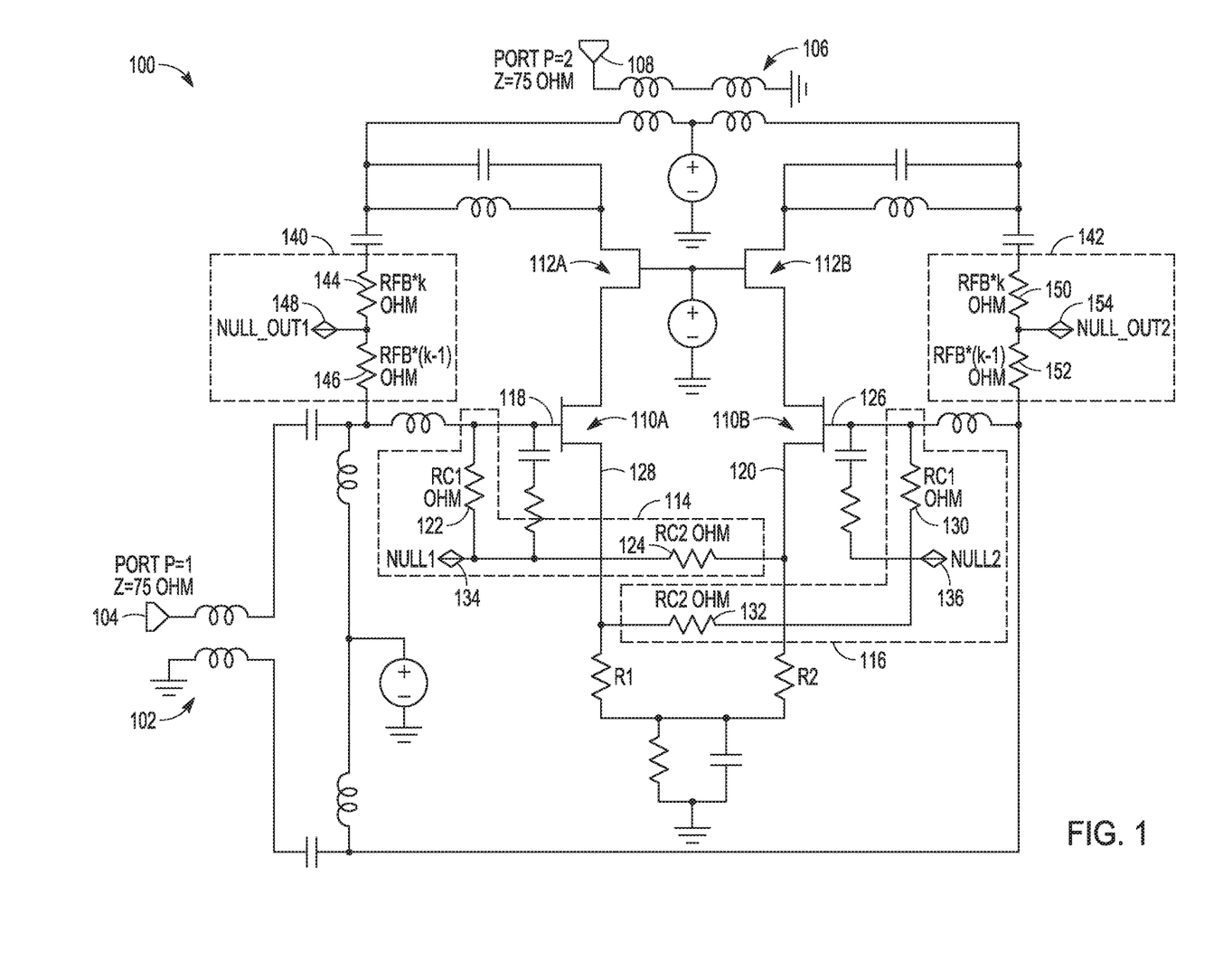
FIG. 1 is an example of a power amplifier circuit including distortion monitoring circuitry that can be used for data communication over a path in a wired communication network.

FIG. 1 is an example of a power amplifier circuit including distortion monitoring circuitry that can be used for data communication over a path in a wired communication network. The power amplifier circuit 100 (also referred to in this disclosure as "amplifier circuit 100"), e.g., a push-pull amplifier configuration, can include a balun 102 coupled to an input 104 of the amplifier circuit 100, a transformer 106 coupled to an output 108 of the amplifier circuit 100, a first pair of transistors 110A, 110B (collectively referred to as "transistors 110") coupled to the input 104 to convert an input voltage to a current, and a second pair of transistors 112A, 112B (collectively referred to as "transistors 112") coupled to the output 108 of the amplifier circuit 100 to convert the current to an output voltage. The first pair of transistors 110 and the second pair of transistors 112 can include field-effect transistors.

In some example configurations, the first pair of transistors 110 and the second pair of transistors 112 can be different types of transistors. For example, the first pair of transistors 110 can include high-electron-mobility (HEMT) transistors, e.g., pseudomorphic HEMT transistors, and the second pair of transistors 112 can include gallium nitride (GaN) transistors.

In the partial (e.g., bottom stage transconductance) monitoring approach mentioned above, the first pair of transistors 110 can be cross-coupled such that a terminal of one transistor, e.g., gate terminal, is coupled to a terminal of the other transistor, e.g., source terminal. A distortion monitoring circuit can be included that has a first resistor network 114 and a second resistor network 116. The first resistor network 114 can be coupled between a control terminal 118 of the transistor 110A, e.g., a gate terminal, and a second terminal 120 of the transistor 110B, e.g., a source terminal. The first resistor network 114 can include two resistors 122, 124.

Similarly, the second resistor network 116 can be coupled between a control terminal 126 of the transistor 110B, e.g., a gate terminal, and a second terminal 128 of the transistor 110A, a source terminal. The second resistor network 116 can include two resistors 130, 132.

The resistance values of the two resistors 122, 124 of the first resistor network 114 are sized to minimize or null a fundamental signal at the node 134 (labeled "NULL1"), resulting in a virtual ground at node 134 and a signal having predominantly intermodulation distortion terms. Similarly, the resistance values of the two resistors 130, 132 of the second resistor network 116 are sized to minimize or null a fundamental signal at the node 136 (labeled "NULL2"), resulting in a virtual ground at node 136 and a second distortion signal having predominantly intermodulation distortion terms. Because of the phase inverting nature of the amplifier, the virtual ground structure can help ensure that the fundamental signal is cancelled. However, the distortion signals generated in the amplifier may not be within a virtual ground structure and hence may not cancel at "NULL1" and "NULL2".

The signals at node 134 and node 136 represent the distortion generated by the transistors 110A, 110B. Node 134 and node 136, e.g., high impedance nodes, can provide monitoring points for the distortion caused by transistors 110A, 110B, which can be the dominant sources of distortion in the amplifier circuit 100. In this manner, the power amplifier circuit 100 can resolve distortion signals at nodes 134, 136 from the intended output signal of the power amplifier circuit 100 rather than sampling the output signal itself from the output 108, which would reduce the strength of the amplifier output and result in power loss. As such, the distortion signals at nodes 134, 136 do not affect the power amplifier's output power capability, e.g., no inherent loss in the fundamental output of the amplifier.

One or both the first and second distortion signals at node 134 and node 136 can be coupled to an output of the power amplifier circuit to provide a distortion feedback signal that can be fed back to a combiner circuit and combined with the input signal to reduce or null the amount of distortion in the transmit signal, as shown and described below with respect to FIGS. 3, 12, and 13.

In some example configurations, the first node 134 and the second node 136 can be coupled to inputs of a differential amplifier (not depicted), and an output of the differential amplifier can be coupled to an output of the power amplifier circuit to provide the distortion feedback signal. The distortion feedback signal can correspond with the distortion of the amplifier circuit 100. The distortion feedback signal can be fed back to a combiner circuit and combined with the input signal to reduce or null the amount of distortion in the transmit signal, as shown and described below with respect to FIGS. 3, 12, and 13.

In the full output monitoring approach mentioned above, a distortion monitoring circuit can be included that has a third resistor network 140 and a fourth resistor network 142. The third resistor network 140 can be coupled in a first feedback path between the input 104 and the output 106 of the power amplifier circuit 100. Similarly, the fourth resistor network 142 can be coupled in a second feedback path between the input 104 and the output 108 of the power amplifier circuit 100.

The resistance values of the two resistors 144, 146 of the third resistor network 140 can be sized to minimize or null a fundamental signal at the node 148 (labeled "NULL_OUT1"), resulting in a virtual ground at node 148 and a third distortion signal having predominantly intermodulation distortion terms, e.g., third order intermodulation distortion terms. Similarly, the resistance values of the two resistors 150, 152 of the fourth resistor network 142 can be sized to minimize or null a fundamental signal at the node 154 (labeled "NULL_OUT2"), resulting in a virtual ground at node 154 and a fourth distortion signal having predominantly intermodulation distortion terms, e.g., third order intermodulation distortion terms.

The signals at node 148 and node 154 can represent the distortion generated by the entire amplifier circuit 100, not just the transistors 110A, 110B as in the partial monitoring approach. Node 148 and node 154, e.g., high impedance nodes, can provide monitoring points for all the distortion terms generated by the circuit 100. In this manner, the power amplifier circuit 100 can resolve distortion signals at nodes 148, 154 from the intended output signal of the power amplifier circuit 100 rather than sampling the output signal itself from the output 108, which would reduce the strength of the amplifier output and result in power loss. As such, the distortion signals at nodes 148, 154 do not affect the power amplifier's output power capability, e.g., no inherent loss in the fundamental output of the amplifier.

One or both node 148 and node 154 can be coupled to an output of the power amplifier circuit to provide a distortion feedback signal that can be fed back to a combiner circuit and combined with the input signal to reduce or null the amount of distortion in the transmit signal, as shown and described below with respect to FIGS. 3, 12, and 13.

In some example configurations, the third node 148 and the fourth node 154 can be coupled to inputs of a differential amplifier (not depicted), and an output of the differential amplifier can be coupled to an output of the power amplifier circuit to provide the distortion feedback signal. The distortion feedback signal can correspond with the distortion of the amplifier circuit. The distortion feedback signal can be fed back to a combiner circuit and combined with the input signal to reduce or null the amount of distortion in the transmit signal, as shown and described below with respect to FIG. 3.

In some example configurations, the partial monitoring approach and the full monitoring approach can be used together such that the distortion signals produced by both approaches can be fed back to a combiner circuit and combined with the input signal to reduce or null the amount of distortion in the transmit signal.

The partial monitoring approach and the full monitoring approach can be sensitive to changes in source impedance. To minimize the effects of source impedance variation, a buffer circuit (not depicted) can be included before the amplifier circuit 100.

Figure 2:
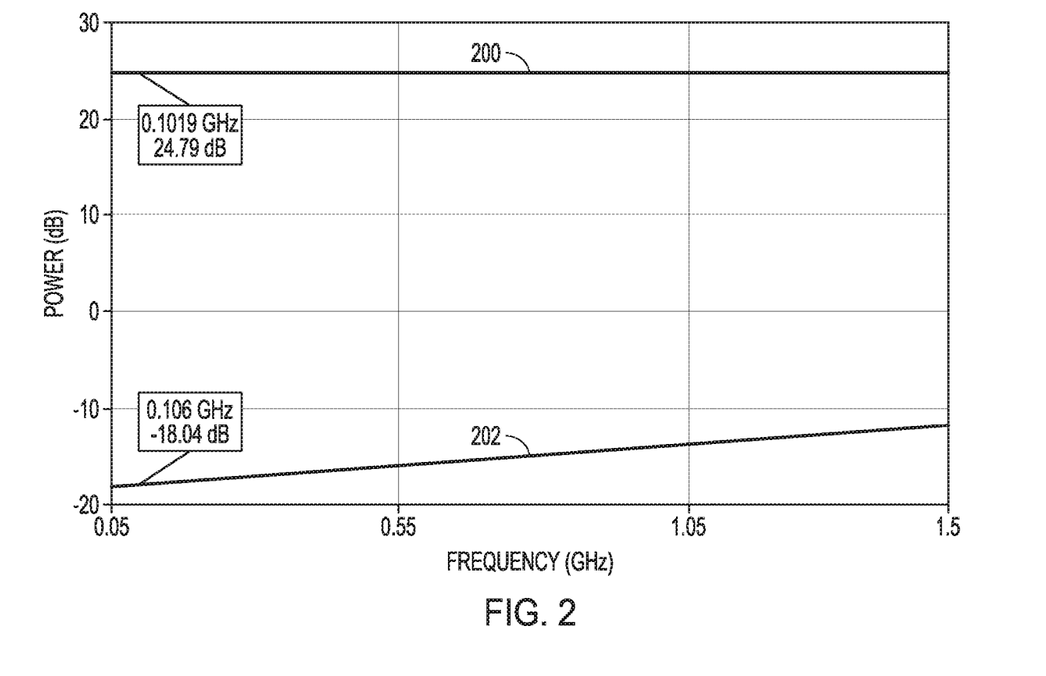
FIG. 2 shows an example of a graph of linear responses of an output signal at a first output port of an amplifier circuit and a distortion feedback signal at a second output port of the amplifier circuit, for different frequencies.

FIG. 2 shows an example of a graph of linear responses of an output signal at a first output port of an amplifier circuit and a distortion feedback signal at a second output port of the amplifier circuit, for different frequencies. The x-axis represents frequency (GHz) and the y-axis represents gain (dB).

The line 200 depicts the forward gain of the amplifier circuit 100 of FIG. 1, at approximately 25 dB at 0.1019 GHz. The line 202 depicts the power of the fundamental signal produced at the output nulling ports "NULL_OUT1" and "NULL_OUT2" in FIG. 1 using the full monitoring approach described above, at approximately −18 dB at 0.106 GHz. The line 202 shows that the power of the fundamental signal has been substantially reduced using the full monitoring approach.

Figure 3:
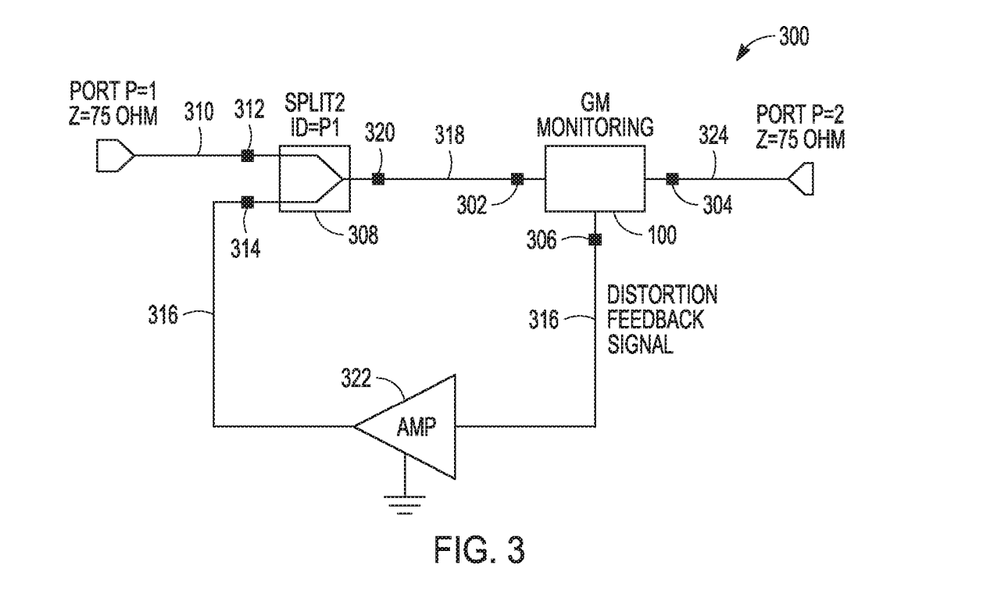
FIG. 3 shows an example of a circuit in a data communication over a path in a communication network that can implement various techniques of this disclosure.

FIG. 3 shows an example of a circuit in a data communication over a path in a communication network that can implement various techniques of this disclosure. The circuit 300 can include the power amplifier circuit 100 of FIG. 1 to generate an amplified output signal and the distortion feedback signal. The amplifier circuit 100 can include an input 302, a first output 304 to provide the amplified output signal, and a second output 306 to provide the distortion feedback signal from one or more of node 134, node 136, node 148, and node 154 of FIG. 1.

The circuit 300 can include a combiner circuit 308 to receive an input signal 310 at a first input 312, e.g., including the data of interest for transmission, and receive at a second input 314 the distortion signal 316 fed back from the amplifier circuit 100, e.g., with a phase change. The combiner circuit 308 can combine the input signal 310 and the distortion feedback signal 316 and generate a combined signal 318 at an output 320 of the combiner circuit 308. For example, the combiner circuit 308 can add an inverted representation of the distortion feedback signal to the input signal.

The circuit 300 can include a scaling circuit 322 coupled between the output 306 of the power amplifier circuit 100 and the second input 314 of the combiner circuit 308. The scaling circuit 322 can adjust a magnitude and phase of the distortion feedback signal 316 to correspond with a magnitude and phase of the input signal 310 to improve the distortion nulling effect of the combination.

Figure 4:
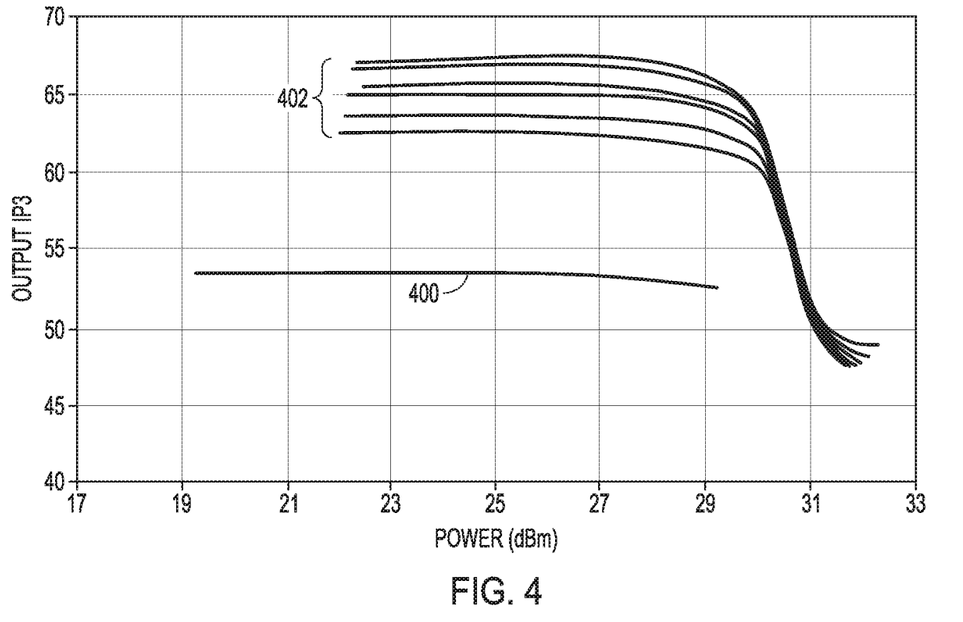
FIG. 4 shows an example of a graph of nulled output third order intercept points (OIP3) of an amplifier circuit utilizing various techniques of this disclosure.

FIG. 4 shows an example of a graph of nulled output third order intercept points ("OIP3") of an amplifier circuit utilizing various techniques of this disclosure. The x-axis represents power (dBm) and the y-axis represents OIP3 power (dBm).

The line 400 represents the output of the amplifier circuit 100 of FIG. 1, without the distortion signal being fed back via a nulling loop to the combiner circuit 308 of FIG. 3. The lines shown generally at 402 represent the output of the amplifier circuit 100 of FIG. 1 with the distortion signal fed back to the combiner circuit 308 of FIG. 3 with the difference in the various lines at 402 being the result of different scaling magnitudes used by a scaling circuit, e.g., scaling circuit 322 of FIG. 3. As seen in FIG. 4, the lines shown generally at 402 represent about a 10 dBm improvement in OIP3, and a 20 dBm intermodulation improvement.

Figure 5:
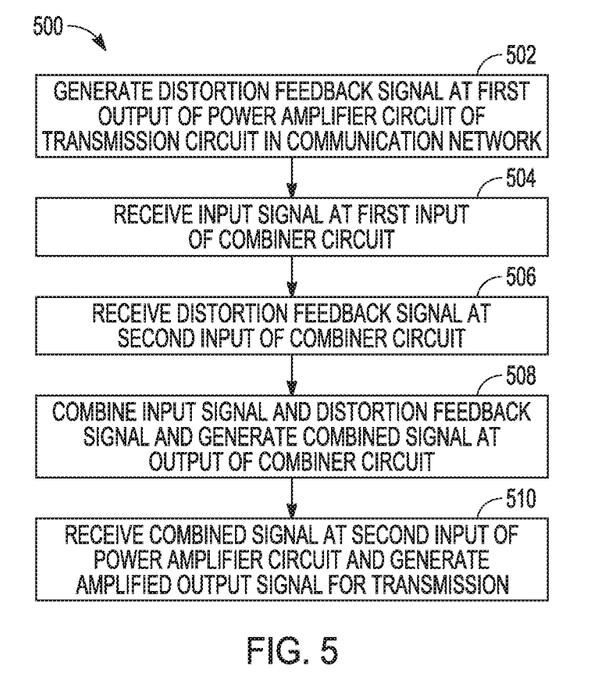
FIG. 5 is an example of a method 500 of transmitting data over a path in a wired communication network using various techniques of this disclosure.

FIG. 5 is an example of a method 500 of transmitting data over a path in a wired communication network using various techniques of this disclosure. At block 502, the method 500 can include generating a distortion feedback signal at a first output of a power amplifier circuit of a transmission circuit in the communication network. For example, the power amplifier circuit 100 of FIG. 3 can generate a distortion feedback signal at the output 306 of FIG. 3, e.g., using the partial (e.g., bottom stage transconductance) monitoring approach and/or the full output monitoring approach described above.

At block 504, the method 500 can include receiving an input signal at a first input of a combiner circuit of the transmission circuit. At block 506, the method 500 can include receiving the distortion feedback signal at a second input of the combiner circuit. For example, the combiner circuit 308 of FIG. 3 can receive an input signal 310 at input 312 and the distortion feedback signal 316 at input 314.

At block 508, the method 500 can include combining the input signal and the distortion feedback signal and generating a combined signal at an output of the combiner circuit, e.g., output 320 of the combiner circuit 308 in FIG. 3.

At block 510, the method 500 can include receiving the combined signal at a second input of the power amplifier circuit and generating an amplified output signal for transmission. For example, the power amplifier circuit 100 of FIG. 3 can receive the combined signal at input 302 and generate at output 304 an amplified output signal 324 for transmission.

Figure 6:
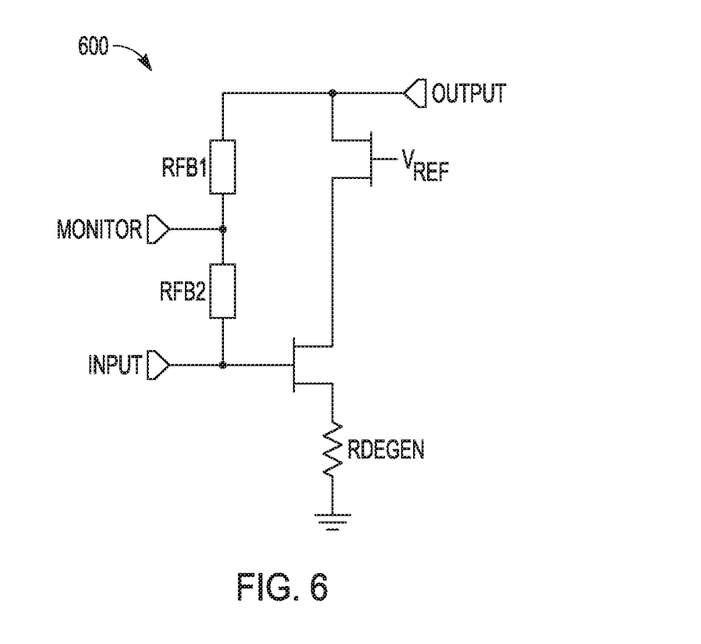
FIG. 6 is simplified version of a portion of the power amplifier circuit of FIG. 1.

FIG. 6 is simplified version of a portion of the power amplifier circuit of FIG. 1. In the circuit 600 of FIG. 6, resistors RFB1 and RFB2 can represent the two resistors 144, 146 of the third resistor network 140 of FIG. 1, and the "monitor" node can represent the node 148 (labeled "NULL_OUT1") or the node 134 of FIG. 1. The present inventor has recognized that the monitor node of FIG. 6, e.g., nodes 148 or 134 of FIG. 1 and similarly node 154 ("NULL_OUT2") or node 136 of FIG. 1, may not differentiate between forward and reverse responses if it does not include directional capability.

In addition, the present inventor has recognized that the circuit of FIG. 1 can have a sensitivity to impedances. For example, the input node of FIG. 6 can be driven from differing input impedances from customer networks, which can impact the virtual ground balance and the monitor nulling of the circuit. Ideally, when balanced, only a distortion signal appears at the "monitor" output.

In addition, input impedance variations can impact the virtual ground balance of the circuit. Further, the output node of FIG. 6 can drive into uncertain output impedances, e.g., of a coaxial network, which can lead to unwanted reflections as customers change their networks.

To overcome or mitigate any sensitivity to impedances, the present inventor has recognized that a solution can include an addition of a directional device on the output of the amplifier. Various directional coupler implementations are shown and described below with respect to FIGS. 7-10.

Figure 7:
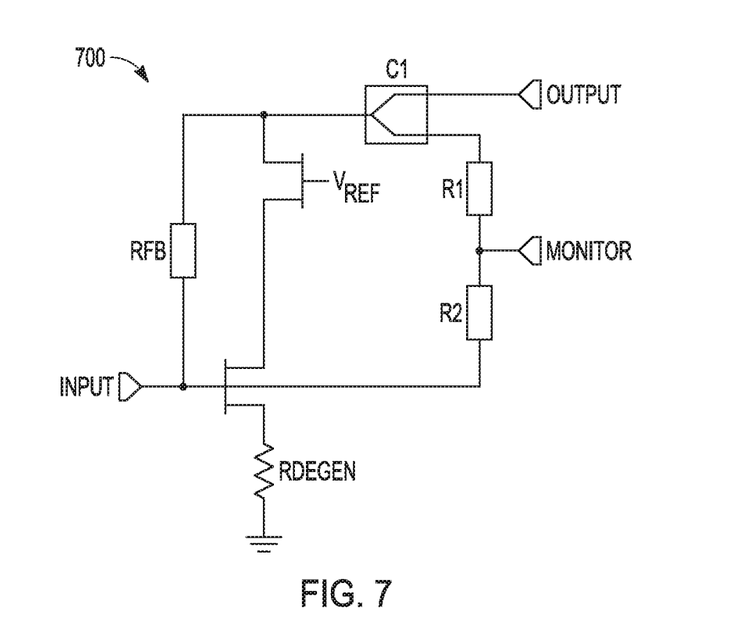
FIG. 7 is a schematic diagram of an example of a power amplifier circuit including distortion monitoring circuitry modified to include directional coupler circuitry.

FIG. 7 is a schematic diagram of an example of a power amplifier circuit including distortion monitoring circuitry modified to include directional coupler circuitry. The present inventor has recognized that adding a directional coupler circuit C1 on the amplifier output node can prevent load mismatches from influencing the nulling circuitry of the power amplifier circuit. By including the directional coupler C1 in the circuit 700, the monitor circuit can respond primarily or only to a forward-going wave and not a reverse-going wave by inhibiting, e.g., preventing or mitigating, the reverse-going wave from being transmitted from the output port to the monitor port. In some configurations, the coupler C1 can have low loss between port 1 and port 2 and high loss between port 2 and port 3. Ideally, a signal entering the output node, e.g., from a customer network, would not appear at the monitor node.

Figure 8:
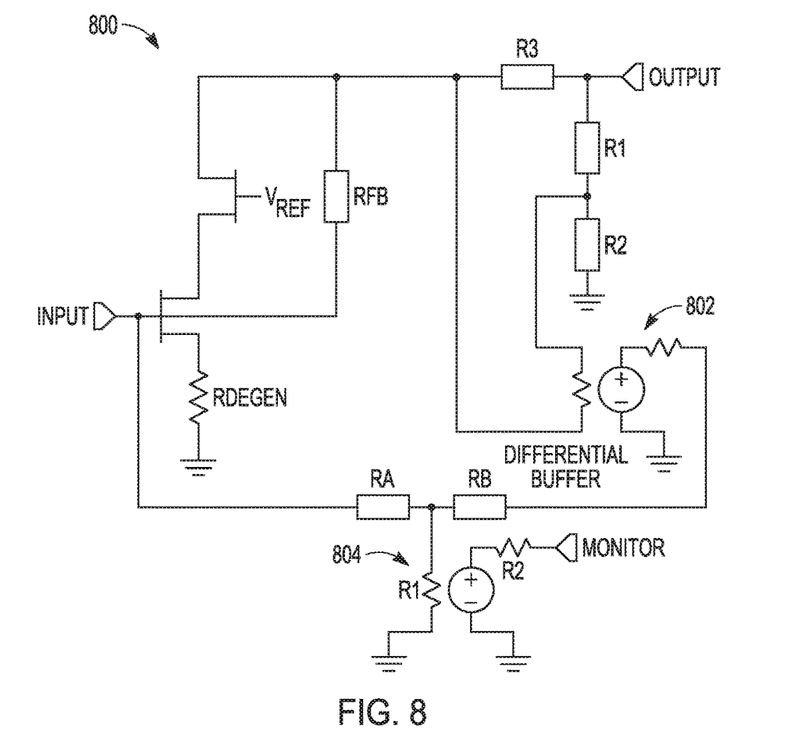
FIG. 8 is a schematic diagram of another example of a power amplifier circuit including distortion monitoring circuitry modified to include directional coupler circuitry.
Figure 9:
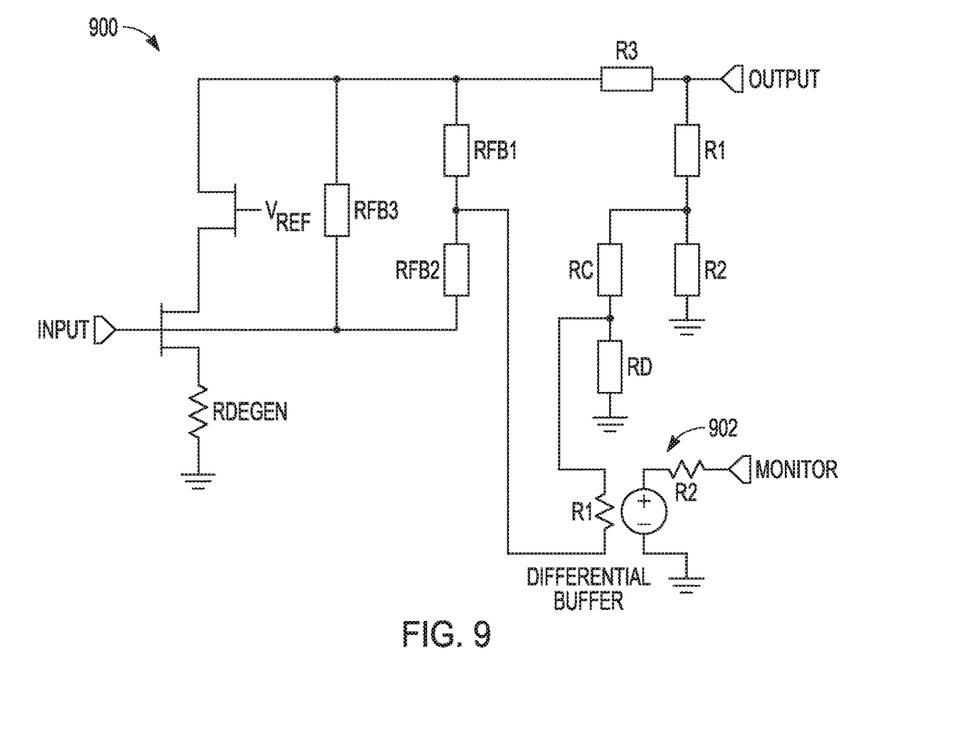
FIG. 9 is a schematic diagram of another example of a power amplifier circuit including distortion monitoring circuitry modified to include directional coupler circuitry.
Figure 10:
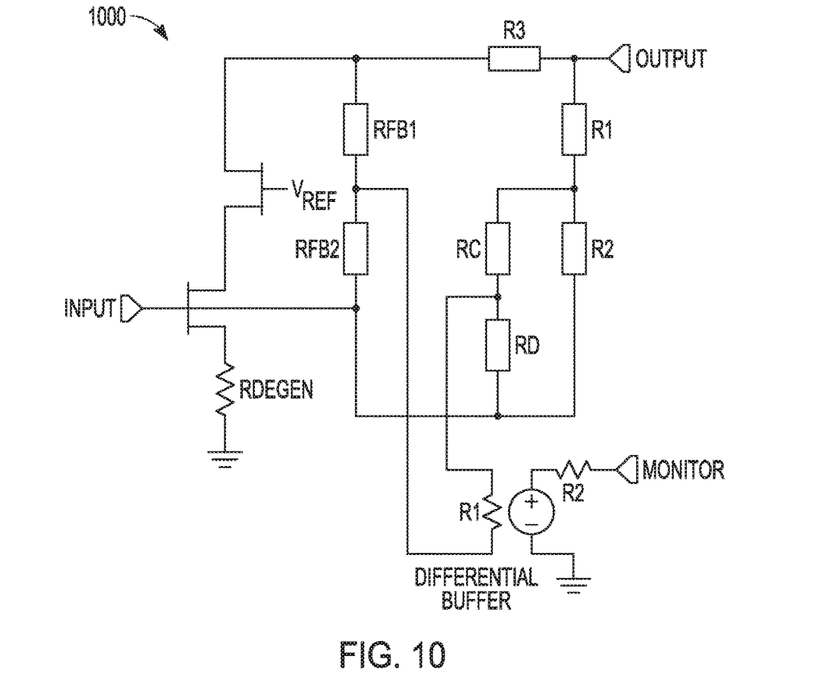
FIG. 10 is a schematic diagram of another example of a power amplifier circuit including distortion monitoring circuitry modified to include directional coupler circuitry.

The coupler C1 can have various coupling ratios. For example, the resistance values of resistors R1 and R2 can be adjusted such that the fundamental response to the "monitor" port is near zero. FIGS. 8-10 depict various directional coupler configurations.

FIG. 8 is a schematic diagram of another example of a power amplifier circuit including distortion monitoring circuitry modified to include directional coupler circuitry. In the circuit 800 of FIG. 8, the directional coupler circuit can include a directional resistive bridge circuit formed by R1-R3 in which an outgoing signal wave can be sensed as a voltage across resistors R1 and R3. Any reflected waves do not appear across this node if the ratio of R1/R2 is approximately the same as R3/Zout, where Zout is the output impedance, e.g., about 37 ohms to about 150 ohms. That is, if a reflected wave is received at the output node, e.g., from a customer network, the differential voltage applied to a differential buffer circuit is zero. Thus, the reflected wave is not present, and the forward-going wave appears as part of the monitoring.

A first stage 802 of a differential buffer circuit is shown as a first voltage-controlled voltage source (VCVS) and a second stage 804 of the differential buffer circuit is shown as a second voltage-controlled voltage source (VCVS). An input signal from the input node can be coupled to resistor RA, and the output of the first stage 802 of the differential buffer circuit can be coupled to resistor RB. The first stage 802 of the differential buffer circuit can drive the nulling resistor pair formed by resistors RA and RB. The second stage 804 of the differential buffer circuit can be coupled between resistors RA and RB and can control the monitor output signal at the "monitor" node.

In some example configurations, it can be desirable to reduce the large signal level present on the directional resistor network R1-R3 of FIG. 8. An example configuration that divides the voltages down is shown in FIG. 9.

FIG. 9 is a schematic diagram of another example of a power amplifier circuit including distortion monitoring circuitry modified to include directional coupler circuitry. In contrast to the example shown in FIG. 8, the circuit 900 shown in FIG. 9 can divide the signal level at the output node down to lower levels while maintaining the desired bridge impedances for directivity. For example, a voltage divider network including resistors RC and RD can be coupled between resistors R1 and R2 of the directional resistor network to decrease the signal level, as seen in FIG. 9.

A directional buffer circuit 902, shown as a VCVS in FIG. 9, can be coupled to the node between resistors RC and RD to sense the output signal and applied to pin 1 of the differential buffer 902. In addition, feedback resistors RFB1 and RFB2 can be used to decrease the signal level and applied to pin 2 of the differential buffer 902.

In some example configurations, feedback resistors RFB1 and RFB2 can perform both the negative feedback and nulling functions while reducing the signal level.

FIG. 10 is a schematic diagram of another example of a power amplifier circuit including distortion monitoring circuitry modified to include directional coupler circuitry. The circuit 1000 in FIG. 10 can use the resistor combination of RFB1 and RFB1 to set a virtual ground and can use resistors R1-R3 as a directional bridge.

In some example configurations, resistors RC and RD can be much larger than resistor R2 and provide signal attenuation so that the fundamental signal input to the differential buffer is approximately zero.

Further, in contrast to the configuration shown in FIG. 9 in which resistors R2 and RD are connected to ground, the resistors R2 and RD in FIG. 10 can be connected to the input to enable virtual operation.

Figure 11:
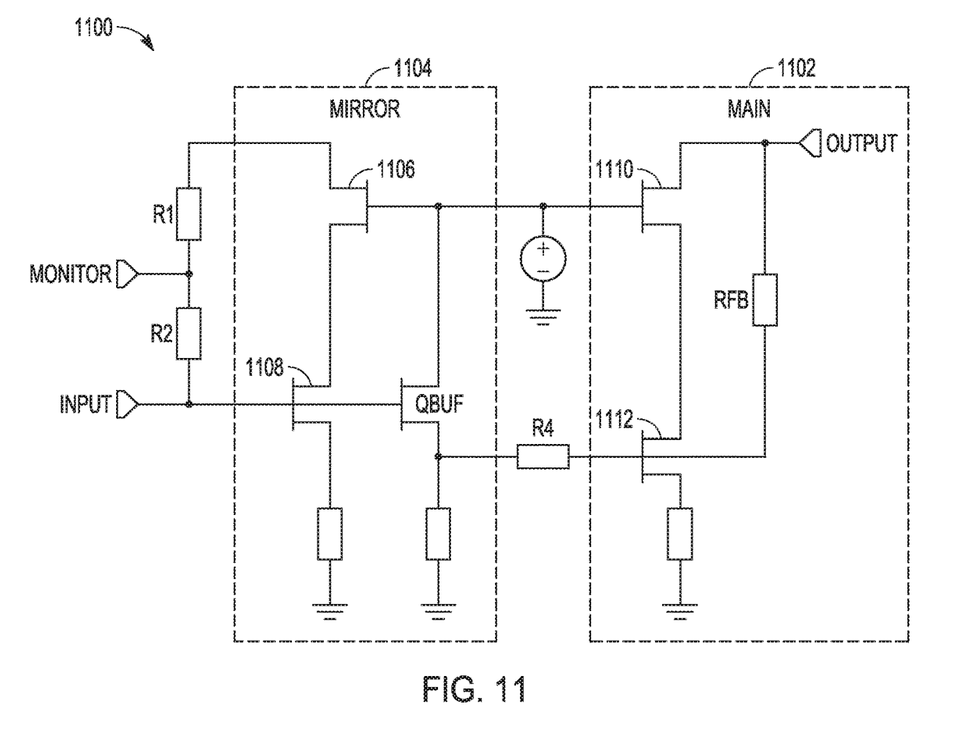
FIG. 11 is a schematic diagram of an example of a power amplifier circuit including distortion monitoring circuitry modified to include mirrored circuitry.

In addition to the directional coupler configurations shown above, the present inventor has also recognized that a solution can include a mirrored monitor circuit, as shown in FIG. 11. By integrating a mirrored version of the main stage, a virtual ground monitor can be achieved.

FIG. 11 is a schematic diagram of an example of a power amplifier circuit including distortion monitoring circuitry modified to include mirrored circuitry. The circuit 1100 of FIG. 11 can include a main circuit (also referred to as a main stage) 1102 and a mirrored circuit (also referred to as a mirrored stage) 1104 that is a replica of the main circuit, e.g., a smaller scaled version of the main circuit. In some example configurations, the mirrored stage 1104 can be a fraction of the size of the main stage 1102, such as about one percent of the size of main stage 1102. In the circuit 1100, the resistors R1 and R2 can form the virtual ground feedback network. Advantageously, the mirrored output labeled "monitor" can be isolated from the main output node labeled "output".

The main stage 1102 can be a simplified version of the circuit shown in FIG. 1, e.g., an amplifier circuit including a cascode transistor configuration with feedback. The mirrored stage 1104 can include transistors 1106, 1108, which can be scaled replicas of the transistors 1110, 1112, of the main stage 1102. The resistances of various resistors of the mirrored stage 1104 can be chosen such the mirrored stage 1104 can have a load line similar to a load line of the main stage 1102. In addition, the mirrored stage 1104 can be biased so that the output impedance of the mirrored stage 1104 can be similar to the output impedance of the main stage 1102.

In some example configurations, the circuit 1100 of FIG. 11 can include buffer circuitry that can include transistor Qbuf and resistor R4, for example, to further isolate the monitor node. The buffer circuitry can help prevent any signals through the feedback resistor RFB in the main stage 1102 from coupling through to the mirrored stage 1104. Because the monitor node of the mirrored stage 1104 can be isolated from the output node of the main stage 1102, any reverse-going wave appearing at the output node does not appear in the mirrored stage 1104. In this manner, any reflections from a customer network coupled to the amplifier circuit will not be seen in the mirror stage.

Figure 12:
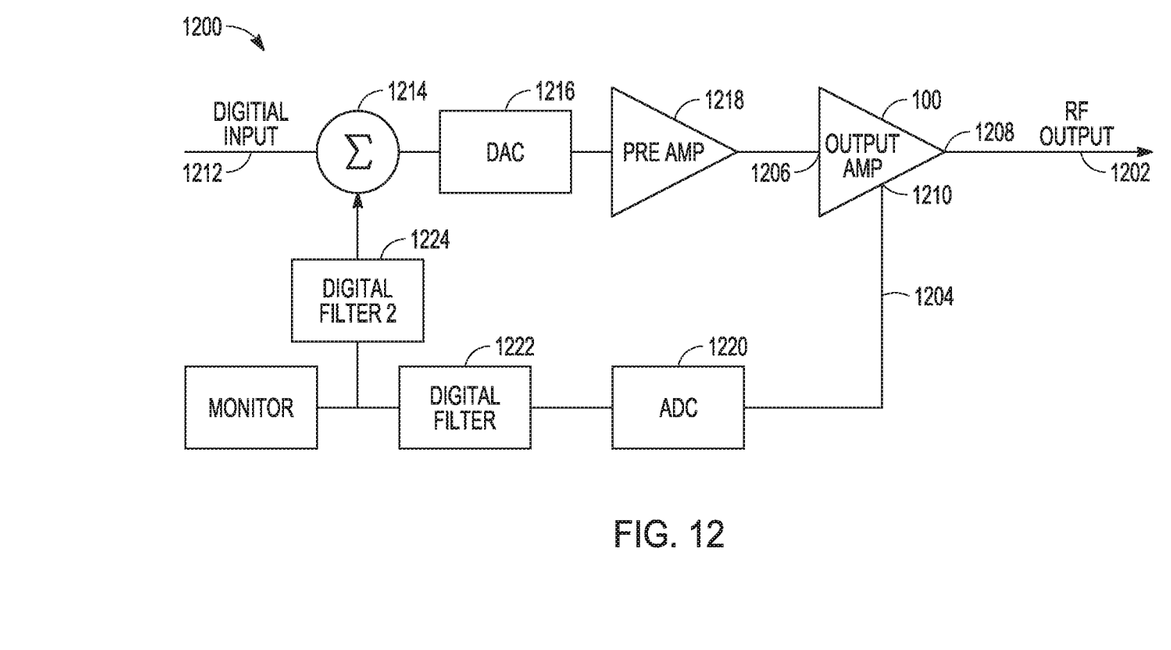
FIG. 12 shows another example of a circuit in a data communication over a path in a communication network that can implement various techniques of this disclosure.

FIG. 12 shows another example of a circuit in a data communication over a path in a communication network that can implement various techniques of this disclosure. The circuit 1200 can include the power amplifier circuit 100 of FIG. 1 to generate an amplified output signal 1202 and a distortion feedback signal 1204 (or distortion monitor output). The amplifier circuit 100 can include an input 1206, a first output 1208 to provide the amplified output signal, and a second output 1210 to provide the distortion feedback signal from one or more of node 134, node 136, node 148, and node 154 of FIG. 1.

In FIG. 12, a digital input signal 1212 can be applied to a combiner circuit 1214, e.g., a summation circuit, and an output of the combiner circuit 1214 is applied to an input of a digital-to-analog converter (DAC) circuit 1216, which converts the signal into the analog domain. In some example configurations, a preamplifier circuit 1218 can optionally be included to boost the signal level into the output amplifier 100. The output amplifier circuit 100 can output the distortion feedback signal 1204 with correlation to the distortion leaving the output amplifier 100. Since the distortion monitor can cancel most of the fundamental response of the amplifier 100, a low cost and low power analog-to-digital converter (ADC) circuit 1220, can convert the distortion monitor signal into the digital domain.

The output of the ADC circuit 1220 can be applied to a first digital filter circuit 1222 to further cancel out any remaining leakage of fundamental signal present on the distortion feedback signal. In some example implementations, the output of the first digital filter circuit 1222 can be applied to a second digital filter circuit 1224 to shape the signal in such a way that distortion from the RF output 1208 is minimized. Then, an output of the second digital filter circuit 1224 can be applied to the combiner circuit 1214 and combined with the digital input 1212 to reduce or null the amount of distortion in the transmit signal 1202.

Figure 13:
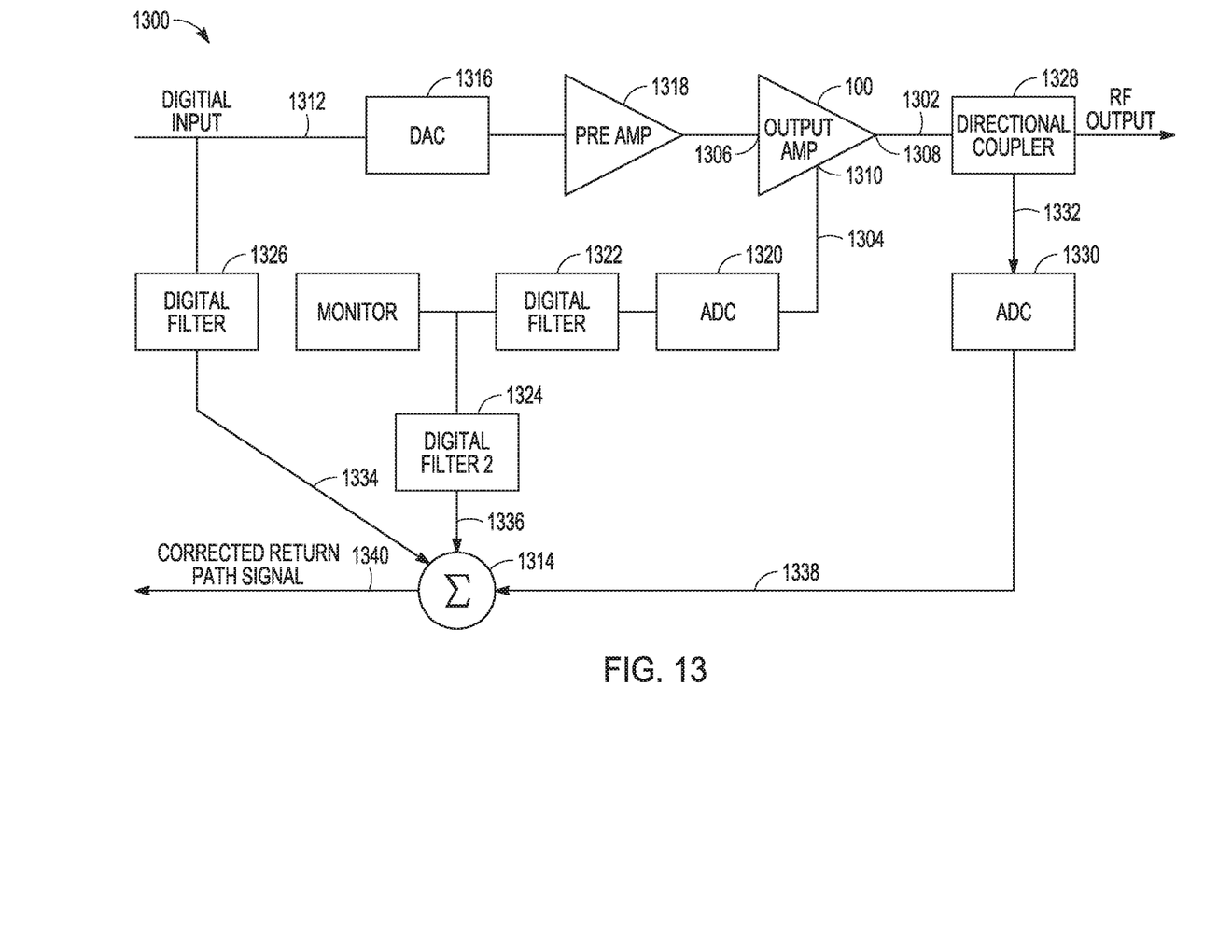
FIG. 13 shows another example of a circuit in a data communication over a path in a communication network that can implement various techniques of this disclosure.

FIG. 13 shows another example of a circuit in a data communication over a path in a communication network that can implement various techniques of this disclosure. The circuit 1300 can include the power amplifier circuit 100 of FIG. 1 to generate an amplified output signal 1302 and a distortion feedback signal 1304 (or distortion monitor output). The amplifier circuit 100 can include an input 1306, a first output 1308 to provide the amplified output signal, and a second output 1310 to provide the distortion feedback signal from one or more of node 134, node 136, node 148, and node 154 of FIG. 1.

In FIG. 13, a digital input signal 1312 is applied to a DAC circuit 1316, which converts the signal into the analog domain. In some example configurations, a preamplifier circuit 1318 can optionally be included to boost the signal level into the output amplifier 100. The output amplifier circuit 100 can output the distortion feedback signal 1304 with correlation to the distortion leaving the output amplifier 100. Since the distortion monitor cancels most of the fundamental response of the amplifier 100, an ADC circuit 1320, e.g., a low cost and low power ADC, can convert the distortion monitor signal into the digital domain.

The output of the ADC circuit 1320 can be applied to a first digital filter circuit 1322 to cancel out any leakage of fundamental signal present on the distortion feedback signal. In some example implementations, the output of the first digital filter circuit 1322 can be observed by a monitor that allows both any remaining fundamental leakage and the distortion from the RF output 1308 to be minimized. Then, an output of the second digital filter circuit 1324 can be applied to a combiner circuit 1314. The digital input 1312 can be applied to a third digital filter circuit 1326 and combined with the output of the second digital filter circuit 1324 using the combiner circuit 1324.

A directional coupler 1328 can be used on the RF output 1308 to receive an intended signal coming from customer premises. Another ADC circuit 1330 can digitize the return signal 1332. The combiner circuit 1314, e.g., a summation circuit, can combine: (1) the filtered input signal 1334 to cancel reflections of the fundamental downstream signal occurring in the coax plant, (2) digitally filtered signal representing the distortion 1336 of this downstream signal, and (3) the intended return path signal 1338. The combiner circuit 1314 can output a corrected return path signal 1340 that can remove both the reflected fundamental and the undesirable reflected distortion of the amplifier.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of reducing an amount of distortion in an output signal of a power amplifier circuit in a wired communication network, the method comprising:
   receiving an input signal at an input of the power amplifier circuit;
   using a distortion monitoring circuit in the power amplifier circuit, generating a distortion feedback signal resolved from an intended output signal at a first output of the power amplifier circuit, wherein the distortion monitoring circuit includes two resistor networks, the two resistor networks including:
      a first resistor network and a second resistor network coupled to terminals of first and second transistors that are coupled to the input of the power amplifier circuit; or
      a third resistor network and a fourth resistor network coupled in corresponding feedback paths between the input and the first output; and
   generating the output signal from the intended output signal at a second output of the power amplifier circuit.

2. The method of claim 1, wherein the distortion monitoring circuit includes the first resistor network and the second resistor network, and wherein using the distortion monitoring circuit in the power amplifier circuit, generating the distortion feedback signal resolved from the intended output signal at the first output of the power amplifier circuit includes:
   cross-coupling the first and second transistors that are coupled to the input of the power amplifier circuit, each of the first and second transistors including a control terminal;
   coupling the first resistor network between the control terminal of the first transistor and a second terminal of the second transistor, and coupling the second resistor network between the control terminal of the second transistor and a second terminal of the first transistor; and
   coupling a first node in the first resistor network and a second node in the second resistor network to the first output of the power amplifier circuit to provide the distortion feedback signal.

3. The method of claim 2, wherein coupling the first node in the first resistor network and the second node in the second resistor network to the first output of the power amplifier circuit to provide the distortion feedback signal includes:
   coupling the first and second nodes to inputs of a differential amplifier, wherein an output of the differential amplifier is coupled to the first output of the power amplifier circuit to provide the distortion feedback signal.

4. The method of claim 2, wherein the first node in the first resistor network is at a first virtual ground potential and the second node in the second resistor network is at a second virtual ground potential.

5. The method of claim 2, further comprising:
minimizing a fundamental signal at the first node, and minimizing the fundamental signal at the second node.

6. The method of claim 1, wherein the distortion monitoring circuit includes the third resistor network and the fourth resistor network, and wherein using the distortion monitoring circuit in the power amplifier circuit, generating the distortion feedback signal resolved from the intended output signal at the first output of the power amplifier circuit includes:
coupling third and fourth transistors to the output of the power amplifier circuit;
coupling the third resistor network in a first feedback path between the input and the output of the power amplifier circuit, and coupling the fourth resistor network in a second feedback path between the input and the output of the power amplifier circuit; and
coupling a third node in the third resistor network and a fourth node in the fourth resistor network to the first output of the power amplifier circuit to provide the distortion feedback signal.

7. The method of claim 6, wherein coupling the third node in the third resistor network and the fourth node in the fourth resistor network to the first output of the power amplifier circuit to provide the distortion feedback signal includes:
coupling third and fourth nodes to inputs of a differential amplifier; and
coupling an output of the differential amplifier to the first output of the power amplifier circuit to provide the distortion feedback signal.

8. The method of claim 7, wherein the third node in the third resistor network is at a third virtual ground potential and the fourth node in the fourth resistor network is at a fourth virtual ground potential.

9. A power amplifier circuit configured to reduce an amount of distortion in an output signal in a wired communication network, the power amplifier circuit comprising:
an input to receive an input signal;
a distortion monitoring circuit configured to generate and output a distortion feedback signal resolved from an intended output signal at a first output, wherein the distortion monitoring circuit includes two resistor networks, the two resistor networks:
a first resistor network and a second resistor network coupled to terminals of first and second transistors that are coupled to the input of the power amplifier circuit; or
a third resistor network and a fourth resistor network coupled in corresponding feedback paths between the input and the first output; and
a second output to provide the output signal.

10. The power amplifier circuit of claim 9, further comprising:
the first and second transistors coupled to the input of the power amplifier circuit, each of the first and second transistors including a control terminal;
wherein the distortion monitoring circuit includes the first and second resistor networks, the first resistor network coupled between the control terminal of the first transistor and a second terminal of the second transistor, and the second resistor network coupled between the control terminal of the second transistor and a second terminal of the first transistor,
wherein a first node in the first resistor network and a second node in the second resistor network are coupled to the first output of the power amplifier circuit to provide the distortion feedback signal.

11. The power amplifier circuit of claim 10, wherein the first and second nodes are coupled to inputs of a differential amplifier.

12. The power amplifier circuit of claim 10, wherein resistance values of resistors of the first resistor network are sized to minimize a fundamental signal at the first node, and wherein resistance values of resistors of the second resistor network are sized to minimize the fundamental signal at the second node.

13. The power amplifier circuit of claim 10, wherein the first node in the first resistor network is at a first virtual ground potential and the second node in the second resistor network is at a second virtual ground potential.

14. The power amplifier circuit of claim 9, further comprising:
a directional coupler circuit coupled to the first output and the second output, wherein the directional coupler circuit is configured to inhibit a reverse-going signal received at the second output from being transmitted to the first output.

15. The power amplifier circuit of claim 9, further comprising:
the third and fourth transistors coupled to the output of the power amplifier circuit;
wherein the distortion monitoring circuit includes the third and fourth resistor networks, the third resistor network in a first feedback path between the input and the output of the power amplifier circuit, and the fourth resistor network in a second feedback path between the input and the output of the power amplifier circuit,
wherein a third node in the third resistor network and a fourth node in the fourth resistor network are coupled to the first output of the power amplifier circuit to provide the distortion feedback signal.

16. The power amplifier circuit of claim 15, wherein the third and fourth nodes are coupled to inputs of a differential amplifier, and wherein an output of the differential amplifier is coupled to the first output of the power amplifier circuit to provide the distortion feedback signal.

17. The power amplifier circuit of claim 15, wherein the third node in the third resistor network is at a third virtual ground potential and the fourth node in the fourth resistor network is at a fourth virtual ground potential.

18. The power amplifier circuit of claim 9, wherein the circuit comprises:
a main circuit configured to generate the output signal; and
a mirrored circuit, wherein the mirrored circuit is a replica of the main circuit, and wherein the first output is an output of the mirrored circuit.

19. A power amplifier circuit configured to reduce an amount of distortion in an output signal in a wired communication network, the power amplifier circuit comprising:
means for receiving an input signal at an input of the power amplifier circuit;
means for generating a distortion feedback signal resolved from an intended output signal at a first output of the power amplifier circuit, wherein the means for generating the distortion feedback signal includes two resistor networks, the two resistor networks including:

a first resistor network and a second resistor network coupled to terminals of first and second transistors that are coupled to the input of the power amplifier circuit; or a third resistor network and a fourth resistor network coupled in corresponding feedback paths between the input and the first output; and means for generating the output signal from the intended output signal at a second output of the power amplifier circuit.

20. The power amplifier circuit of claim 19, wherein the means for generating the distortion feedback signal resolved from an intended output signal at the first output of the power amplifier circuit includes a first node at a first virtual ground potential and a second node at a second virtual ground potential.

* * * * *

UNITED STATES PATENT AND TRADEMARK OFFICE
CERTIFICATE OF CORRECTION

| | | |
|---|---|---|
| PATENT NO. | : 10,998,863 B2 | Page 1 of 1 |
| APPLICATION NO. | : 16/133282 | |
| DATED | : May 4, 2021 | |
| INVENTOR(S) | : Christopher John Day | |

It is certified that error appears in the above-identified patent and that said Letters Patent is hereby corrected as shown below:

In the Claims

In Column 13, Line 47, in Claim 9, delete "networks:" and insert --networks including:-- therefor Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*